United States Patent
Bhagavatheeswaran et al.

(10) Patent No.: US 6,753,719 B2
(45) Date of Patent: Jun. 22, 2004

(54) SYSTEM AND CIRCUIT FOR CONTROLLING WELL BIASING AND METHOD THEREOF

(75) Inventors: Gayathri A. Bhagavatheeswaran, Austin, TX (US); Hong Tian, Austin, TX (US); Christopher Chun, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 26 days.

(21) Appl. No.: 10/227,893

(22) Filed: Aug. 26, 2002

(65) Prior Publication Data

US 2004/0036525 A1 Feb. 26, 2004

(51) Int. Cl.$^7$ ................................................ H03K 3/01
(52) U.S. Cl. ........................................................ 327/534
(58) Field of Search ................................ 327/530, 534, 327/535, 536, 537

(56) References Cited

U.S. PATENT DOCUMENTS

| | | |
|---|---|---|
| 5,202,587 A | 4/1993 | McLaury |
| 5,394,026 A | 2/1995 | Yu et al. |
| 5,610,540 A | 3/1997 | Althoff et al. |
| 6,097,113 A * | 8/2000 | Teraoka et al. ............. 307/125 |
| 6,333,571 B1 * | 12/2001 | Teraoka et al. ............. 307/125 |
| 6,337,813 B2 | 1/2002 | Marr |
| 6,380,798 B1 * | 4/2002 | Mizuno et al. ............. 327/534 |
| 6,469,568 B2 * | 10/2002 | Toyoyama et al. .......... 327/534 |
| 6,486,727 B1 * | 11/2002 | Kwong ....................... 327/534 |
| 6,518,825 B2 * | 2/2003 | Miyazaki et al. ........... 327/534 |

* cited by examiner

Primary Examiner—Jeffrey Zweizig
(74) Attorney, Agent, or Firm—Toler, Larson & Abel, LLP

(57) ABSTRACT

A well bias controller receives input from a sensor. The sensor indicates when a desired threshold condition, such as a temperature or current limit has been exceeded. Threshold conditions are chosen so that when the threshold condition is exceeded, the amount of current drawn by the well bias circuit and through the transistor exceeds the amount of leakage current that would otherwise occur in the device if a well bias circuit were not used. Whenever it is determined, based on the threshold condition, that the well bias circuit is using more current than a device would otherwise leak, the controller turns the well bias circuit off.

32 Claims, 3 Drawing Sheets

SYSTEM AND CIRCUIT FOR CONTROLLING WELL BIASING AND METHOD THEREOF

FIELD OF THE DISCLOSURE

This disclosure relates generally to biasing semiconductor wells, and more particularly to controlling semiconductor well biasing.

BACKGROUND

As semiconductor processes advance, the size of the devices that can be constructed on a semiconductor substrate continues to grow smaller. With the reduction in device sizes comes corresponding reductions in gate oxide thicknesses, and lowered threshold voltage requirements. In addition, as device sizes shrink, the problem with current leaking between devices, and between various device features, is exacerbated. Limiting device leakage currents is important, especially in hand-held, battery-operated products where power consumption often dictates product success. Since many handheld products are typically not used for significant periods of time—up to 95% of the time for some products controlling the current leakage of semiconductor devices during periods when the product is not in use can result in reduced power consumption.

One method of reducing the leakage current of a semiconductor device is to increase the voltage needed to turn the transistors of the device on. For example, when a complimentary metal oxide semiconductor (CMOS) transistor is to be turned on, enough voltage must be supplied at the gate of the CMOS transistor to allow current to flow between the transistor's source and drain. The amount of voltage needed is called the threshold voltage. In order to ensure that current does not leak between the CMOS transistor's source and drain when the transistor is not in use, a well bias circuit, or charge pump, is used to increase the transistor's threshold voltage. As a result of the increased threshold voltage, the leakage current between the transistor's source and drain can be reduced or eliminated.

However, the well bias circuit uses some amount of current for its own operation and there are cases in which the amount of current used by the well bias circuit is greater than the amount of leakage current that would occur if no well bias circuit were used. As a result, use of the well bias circuit may, in some cases, actually increase the overall amount of current used by the consumer product, thereby shortening battery life.

What is needed, therefore, is a way to decrease the total current used by a product, regardless of whether the current is being leaked by a semi-conductor device within the product, or whether the current is being consumed by a well bias circuit.

BRIEF DESCRIPTION OF THE DRAWINGS

Various advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

Figure 1:
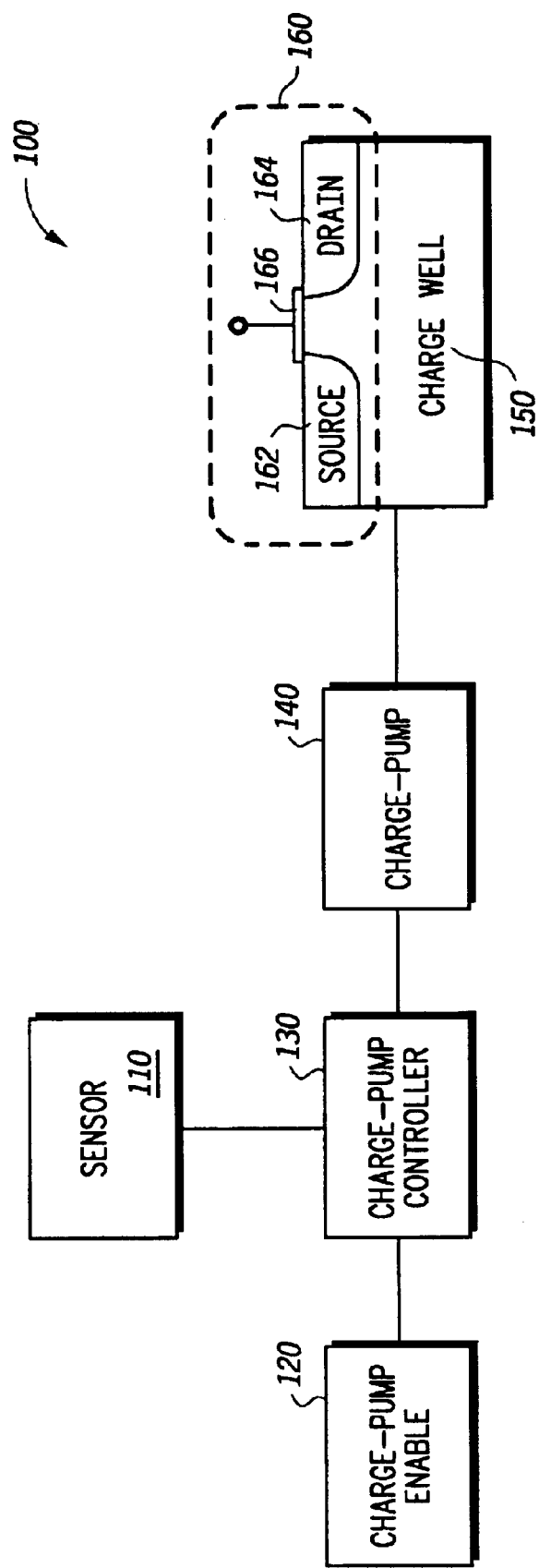
FIG. 1 is a diagram illustrating a well bias system according to one embodiment of the present disclosure.
Figure 2:
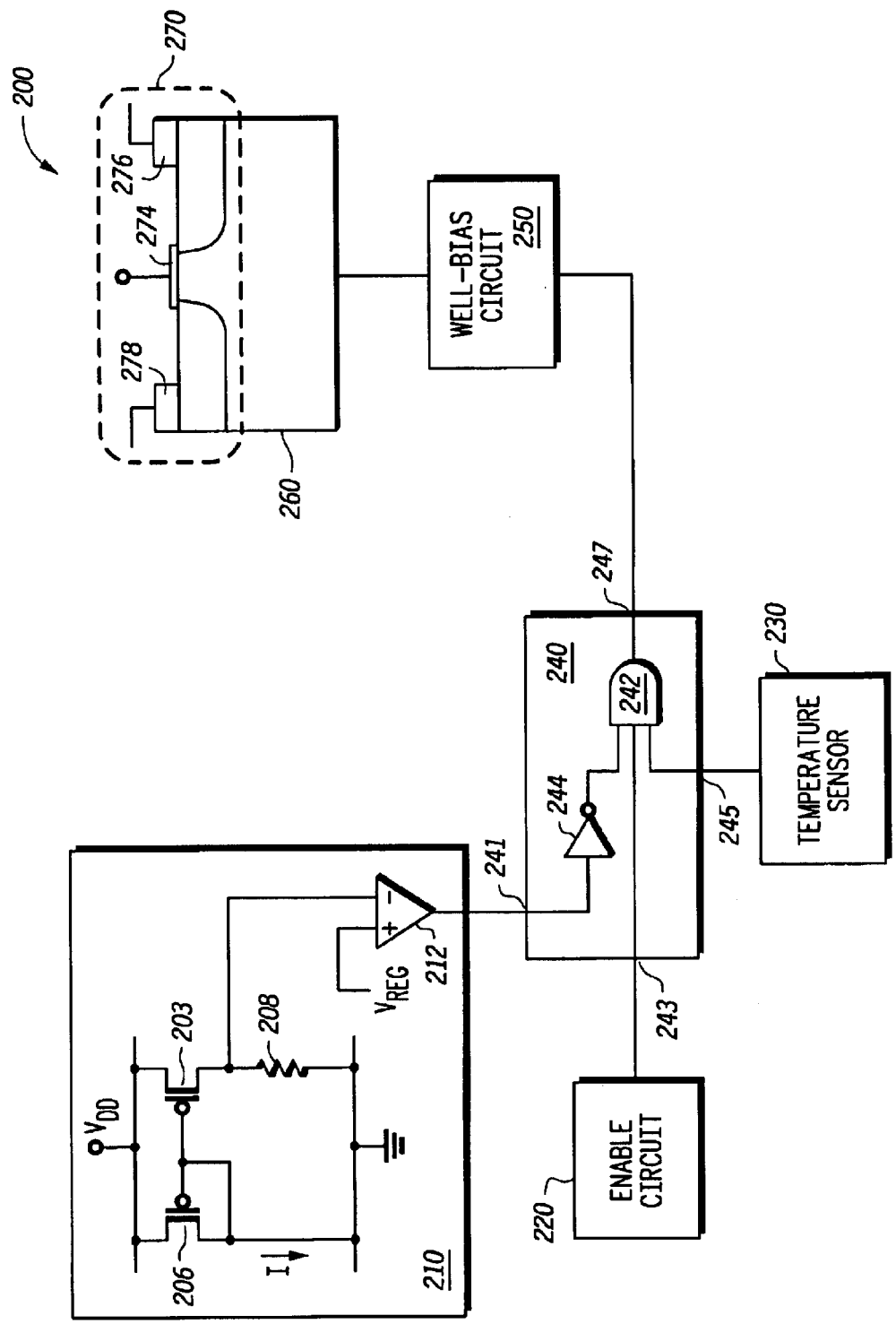
FIG. 2 is a combined schematic and block diagram illustrating a well biasing system according to another embodiment of the present disclosure.
Figure 3:
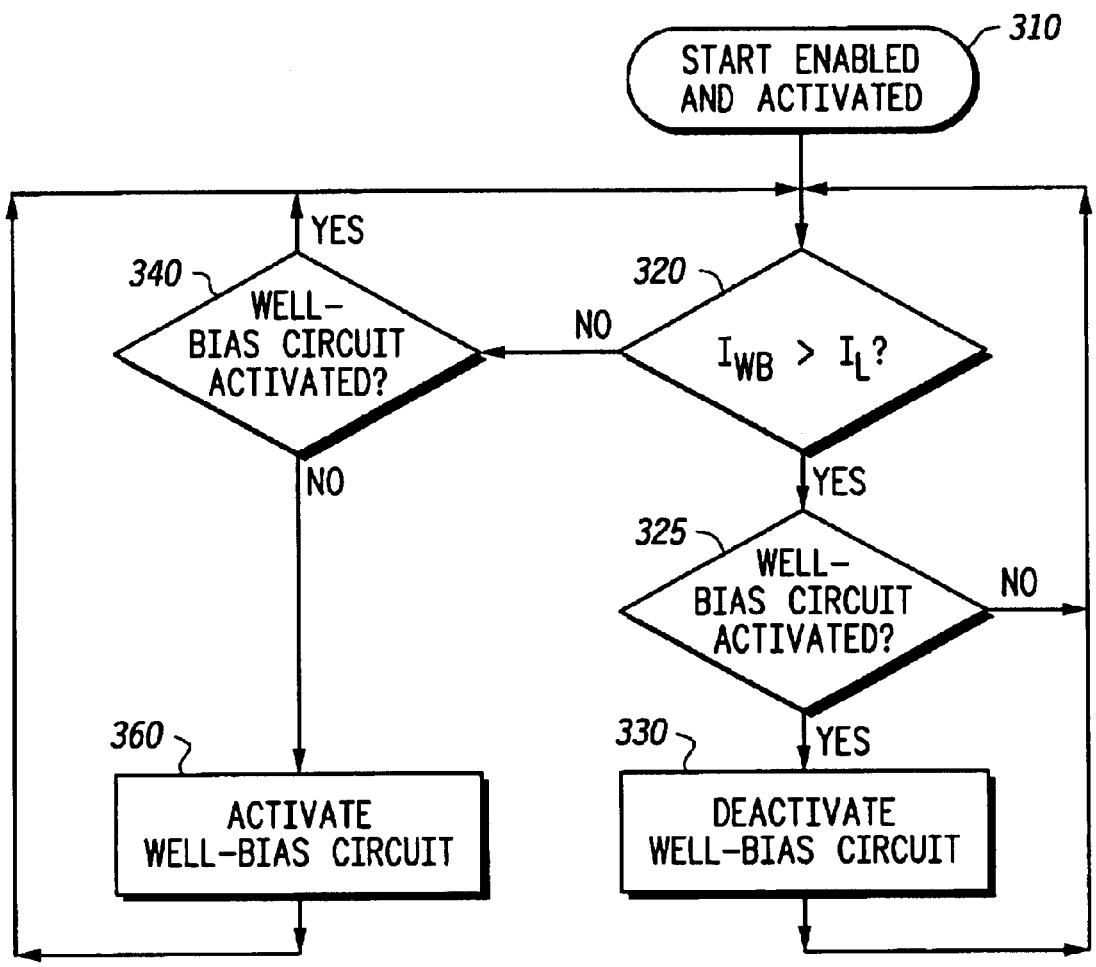
FIG. 3 is a flow chart illustrating a method according to one embodiment of the present disclosure.

FIGS. 1 through 3 illustrate a system and method for dynamically altering the bias of a semiconductor charge well. When a semiconductor device is not in use, and when a well biasing circuit is enabled, a well bias controller will permit the well biasing circuit to operate and increase the amount of charge stored in a charge well. By increasing the amount of charge in the charge well, the threshold voltage of the semiconductor device is increased and the leakage current of that device is decreased. Whenever the amount of leakage current that would normally occur without a bias circuit is less than the amount of operating current used by the well biasing circuit, the well bias controller will turn off the well bias circuit, thereby effecting an overall reduction in current use.

Referring first to FIG. 1, a well bias system according to an embodiment of the present disclosure will be discussed, and is designated generally Control System 100. Control System 100 includes Charge Pump Controller 130, Sensor 110, Charge Pump Enable Circuit 120, Charge Pump 140, Charge Well 150 and Transistor 160. Transistor 160 further includes, Source 162, Drain 164 and Gate 166. It will be appreciated that Transistor 160 may be one of many active devices in a typical integrated circuit. Charge Pump Controller 130 receives input from Sensor 110 and Charge Pump Enable Circuit 120. Based on the inputs received, Charge Pump Controller 130 turns Charge Pump 140 on or off as needed. Charge Pump 140 is connected to well 150 to control the charge stored in Charge Well 150, such that the threshold voltage can be increased. By controlling the threshold voltage, the overall amount of current including the amount of leakage current between Source 162 and Drain 164 will be reduced.

Since the purpose of Charge Pump 140 is to control the threshold voltage and thereby decrease the amount of leakage current, if Charge Pump 140 draws more current than the amount of current that would normally be leaked by Transistor 160, the use of Charge Pump 140 becomes counterproductive. For example, operation of semiconductor devices at a specific voltage are generally characterized using process temperature corners: a first corner of operation may be defined by a worst case temperature and worst case process scenario; a second corner of operation may be defined by a worst case temperature and best case process scenario; a third corner of operation may be defined by a best case temperature and a best case process scenario; and a fourth corner of operation may be defined by a best case temperature and a worst case process scenario. It will be appreciated that semiconductor devices are designed to operation within these corners.

Simulations show that the operating current of Charge Pump 140 increases faster than the amount of current leaked by Transistors as the temperature decreased. This results in a non-productive use of Charge Pump 140 with respect to limiting the leakage current of Transistors. For example, simulations specifying temperatures below approximately 0 degrees Fahrenheit have shown the use of Charge Pump 140 to be counterproductive.

Under actual operating conditions, it may be advantageous to compare an estimated amount of leakage current, rather than comparing measured currents. The estimated current usage of both Charge Pump 140 and the estimated leakage current of Transistor 160 can be established empirically based on process measurements, simulations, etc., or a "substitute" current that is related to the desired current may be measured. Alternatively, actual leakage measurements may be performed.

The reason actual measured currents may not be desirable can be understood upon consideration of the operating principles of a charge pump. A charge pump operates as a charge source to reduce leakage current by supplying extra charge to a charge well of a transistor. As a result of the extra charge being supplied, the leakage current flowing through a transistor when the charge pump is operating is substantially less than the amount of leakage current that would be flowing in the absence of a charge pump. Therefore, the amount of leakage current actually flowing through the transistor during operation of the charge pump would, in general, be less than the amount of current being used to operate the charge pump. However, in at least one embodiment, the actual condition governing whether the charge pump should be turned off, is whether the charge pump is using more current than it is saving and in the form of reduced leakage current.

The practical effect of using Charge Pump 140 then is that a hypothetical user of a cell phone living in a Northern tier state, where temperatures often fall below 0 degrees Fahrenheit, would actually find the battery life of her cell phone shortened if Charge Pump 140 were used in an attempt to limit the leakage current of Transistor 160. This is, of course, the exact opposite effect desired for Charge Pump 140. However, temperatures in Northern tier states are also frequently well above 0 degrees Fahrenheit, and so during the summer months for example, use of Charge Pump 140 would be advantageous in increasing the battery life of the cell phone, since the amount of current used by Charge Pump 140 at high temperatures is less than the amount of leakage current normally consumed by Transistor 160. Therefore, at warmer temperatures Charge Pump 140 actually does decrease the amount of current used by the consumer device, as intended.

Charge Pump Controller 130, therefore, serves the purpose of turning Charge Pump 140 on when the amount of current used by Charge Pump 140 is less than the actual or estimated amount of leakage current normally produced by Transistor 160, and turning Charge Pump 140 off whenever the amount of current used by Charge Pump 140 exceeds the estimated amount of leakage current in Transistor 160. Therefore, by using Charge Pump Controller 130, the total amount of current used by a consumer device can be reduced.

Sensor 110 is, in one embodiment, a temperature sensor. Many consumer devices already include temperature sensors that can be used by Charge Pump Controller 130, however, a dedicated temperature sensor can be used in place of or in addition to such a temperature sensor. Temperature Sensor 110 provides a signal to Charge Pump Controller 130 when a threshold temperature is exceeded. For example, Sensor 110 may be configured to assert a signal whenever the sensed temperature falls below 0 degrees Fahrenheit where 0 degrees Fahrenheit is defined to be the threshold temperature. In other embodiments Sensor 110 may provide Charge Pump Controller 130 with a "raw" signal related to a sensed temperature. Such a signal may be, for example, a voltage proportional to a sensed temperature where Charge Pump Controller 130 interprets the "raw" signal provided by Sensor 110, and logic (not illustrated) within Charge Pump Controller 130 is used to determine when Charge Pump 140 will be turned on or off.

While only a single Sensor 110 is illustrated, additional sensors may be used as input to Charge Pump Controller 130. In addition, other sensor types besides temperature sensors, for example current sensor or combined current/temperature sensors, may be used as input to Charge Pump Controller 130. These other sensor types may also provide signals to Charge Pump Controller 130 when a particular threshold condition is exceeded. In all cases, the threshold condition is chosen such that the threshold condition is triggered when the amount of current used by Charge Pump 140 exceeds the normal leakage current of Transistor 160 when no well bias circuit is in use. In this way, when Sensor 110 indicates to Charge Pump Controller 130 that the threshold condition has been exceeded Charge Pump Controller 130 will deactivate Charge Pump 140.

Charge Pump Enable Circuit 120 is also used in the illustrated embodiment. Charge Pump Enable Circuit 120 asserts a signal to Charge Pump Controller 130 that indicates whether Charge Pump 140 is enabled. For example, the cell phone user in the previous example may be given an option to set his cell phone to "winter mode" or "summer mode". In winter mode, Charge Pump Enable Circuit 120 may indicate to Charge Pump Controller 130 that Charge Pump 140 is not to be activated under any circumstances. However, if the user selects summer mode, Charge Pump Enable Circuit 120 would indicate to Charge Pump Controller 130 that Charge Pump 140 may be enabled as needed, depending on the condition indicated by Sensor 110. In at least one embodiment Charge Pump Enable Circuit 120 performs a similar function as Sensor 110, and may actually be considered as a type of sensor. For example, in the winter/summer example, the winter setting may be considered to be a threshold value such that Charge Pump Controller 140 is always activated during the winter and never activated during the summer.

Referring next to FIG. 2, another embodiment of a well bias control system according to an embodiment of the present disclosure will be discussed, and is designated generally Well Bias System 200. Well Bias System 200 includes Controller 240 coupled to Current Sensor 210, Temperature Sensor 230, Enable Circuit 220, and Well Bias Circuit 250. Well Bias Circuit 250 is further coupled to Semiconductor Charge Well 260, in which Transistor 270 is formed. Transistor 270 includes Source 278, Drain 276 and Gate 274.

Enable Circuit 220 has an output coupled to an input of Controller 240, and provides Controller 240 with a signal that is asserted when Well Bias Circuit 250 is enabled, and is de-asserted when Well Bias Circuit 250 is disabled. Temperature Sensor 230 and Current Sensor 210 each have outputs coupled to inputs of Controller 240, and are used to provide signals that may be asserted when either a temperature and/or current threshold is exceeded. Controller 240 has an output coupled to the input of Well Bias Circuit 250 to provide a signal that is asserted whenever Well Bias Circuit 250 is enabled by Enable Circuit 220, and both a temperature threshold and a current threshold are exceeded. Note that in other embodiments both a current threshold and a temperature threshold do not need to be exceeded in order for Controller 240 to assert the signal to Well Bias Circuit 250. Instead, one or the other of the current threshold or the temperature threshold may be exceeded thereby causing the output of Controller 240 to be asserted.

Well Bias Circuit 250, which in one embodiment serves as a charge source, includes an input coupled to Controller 240 to receive a control signal. Well Bias Circuit 250 further includes an output coupled to Well 260. When the signal from Controller 240 is asserted, Well Bias Circuit 250 is turned on. When Well Bias Circuit 250 is turned on, the output of Well Bias Circuit 250 is used to increase the amount of charge stored in Well 260, thereby increasing the threshold voltage. Recall that increasing the threshold voltage tends to reduce leakage current.

Controller 240 includes Inverter 244 coupled between a current sensor input 241 and AND Gate 242. AND Gate 242 includes two additional inputs, one of which is coupled to an Enable Circuit Input 243 and the other of which is coupled to a Temperature Sensor Input 245. In addition to the three inputs of AND Gate 242, AND Gate 242 includes an output, which is coupled to a Well Bias Circuit Output 247 of Controller 240. It will be appreciated that the logic illustrated in FIG. 2 functions to assert a signal provided to Well Bias Circuit 250 only when Well Bias Circuit 250 is enabled, and both a temperature limit and a current limit have been exceeded. However, in other embodiments, the logic within Controller 240 may also include various logic gates, etc, to permit Well Bias Circuit 250 to be enabled by different combinations of signals from Enable Circuit 220, Current Sensor 210 and Temperature Sensor 230.

Current Sensor 210 includes Transistor 206 having a first current electrode coupled to a voltage source such as $V_{DD}$, a second current electrode coupled to a different voltage level such as ground, and a control node coupled both to ground and to the control node of a second Transistor 203. Transistor 203 in addition to having a control node coupled to the control node of Transistor 206, includes a current electrode coupled to $V_{DD}$ and a second current electrode coupled through Resistor 208 to ground. The second current electrode is also coupled to an inverting input of Differential Amplifier 212. Differential Amplifier 212 has a non-inverting input coupled to a regulated voltage supply $V_{REG}$ and an output coupled to the output of Current Sensor 210.

In operation, as current I flows through the second current electrode of Transistor 206, Resistor 208 generates a voltage drop. The voltage developed across Resistor 208 is related to the amount of current I, which tracks the amount of leakage current that would normally be flowing through Transistor 270 if Well Bias Circuit 250 were not used. When the high side voltage of Resistor 208 exceeds the regulated reference voltage $V_{REG}$ at the non-inverting input of Differential Amplifier 212, the signal from Current Sensor 210 goes low. Assuming negative logic, this low signal output by Differential Amplifier 212 corresponds to asserting a signal to Controller 240. The low signal provided to Controller 240 is inverted by Inverter 244 thereby providing one of the necessary inputs to AND Gate 242. Temperature Sensor 230 and Enable Circuit 220 also provide asserted signals to Controller 240, Controller 240 will activate Well Bias Circuit 250.

It will be appreciated that when the voltage developed across Resistor 208 varies with current I; as current I increases, then the voltage across Resistor 208 increases. Although current I may be a measure of the leakage current in Transistor 270, current I is designed to increase as the leakage current Transistor 270 would normally increase if no additional well bias were provided to Well 260. Therefore, current I can be measured as a "substitute" for measuring the leakage current in Transistor 270.

$V_{REG}$ is set as a threshold voltage to compare against the high side voltage of Resistor 208. When the high side voltage of Resistor 208 exceeds $V_{REG}$, then the amount of current I has exceeded the amount of current being drawn by Well Bias Circuit 250. $V_{REG}$ may be chosen based on empirical observations, simulations, theoretical calculations, or otherwise. In one embodiment, $V_{REG}$ may not be a fixed value, but instead may be a dynamic reference voltage that tracks the current usage of Well Bias Circuit 250 or otherwise.

Referring next to FIG. 3, a method according to an embodiment of the present disclosure is illustrated. As indicated in Start Block 310, the illustrated method begins with a well bias circuit both enabled and activated. In the active state, the well bias circuit raises the threshold voltage of a semiconductor device by increasing the voltage potential of a charge well in which the device is formed. While the charge well is held at the increased potential, the amount of device leakage current is decreased. However, minimizing the device leakage current comes at the cost of expending current to operate the well bias current.

In step 320, a well bias controller determines whether the amount of current required for operation of well bias circuit ($I_{wb}$) is greater than the amount of current ($I_L$) that would be leaked by a device in the absence of the well bias circuit. The determination in step 320 may be made in any suitable manner, but in at least one embodiment the determination is made based on sensor inputs as previously discussed. Note that one or both of the currents being compared in step 320 may be estimated currents or measured substitute currents as discussed previously. For example, $I_{wb}$ and/or $I_L$ may be an empirically determined estimate of the amount of current generally used by the well bias circuit or other device under particular environmental conditions, and may be represented by a predetermined signal level. If $I_{wb}$ is greater than $I_L$, then the use of the well bias circuit would be counterproductive.

The state of the well bias circuit, either activated or deactivated, is determined in step 325. If it was determined in step 320 that $I_{wb}$ is greater than $I_L$, and it is determined in step 325 that the well bias circuit is activated, then the method proceeds to step 330, in which the well bias circuit is deactivated. If, however, it is determined in step 325 that the well bias circuit is not currently activated, then the method returns to step 320.

In the event that it is determined in step 320 that $I_{wb}$ is not greater than $I_L$, then the method proceeds to step 340, which determines whether the well bias circuit is currently activated. Unlike step 325, if it is determined in step 340 that the well bias circuit is currently active, then no action is taken, and the method returns to step 320. The reason for the dissimilarity should be apparent if one considers that the combination of steps 320 and 340 are used to determine whether the well bias circuit needs to be re-activated, while the combination of steps 320 and 330 are used to determine whether the well bias circuit should be shut down.

If it is determined in step 320 that $I_{wb}$ is not greater than $I_L$, and in step 340 that the well bias current is not activated, then step 360 is performed to activate the well bias circuit, and the method returns to step 320.

In the preceding detailed description of the figures, reference has been made to the accompanying drawings, which form a part thereof, and in which is shown by way of illustration specific embodiments in which the invention may be practiced. These embodiments are described in sufficient detail to enable those skilled in the art to practice the disclosure, and it is to be understood that other embodiments may be utilized and that logical, mechanical, chemical, and electrical changes may be made without departing from the spirit or scope of the disclosure. For example while the above discussion refers primarily to CMOS transistors, other semi-conductor fabrication processes and/or semi-conductor devices may benefit from applications of the teachings set forth herein. In addition, although specific sensor types have been discussed in particular embodiments above, other sensors may be employed when implementing the present disclosure.

In the previous detailed description of the figures, the terms "assert" and "negate" (or "de-assert") are used when referring to the rendering of a signal status bit or similar apparatus into its logically true or logically false state, respectively. If the logically true state is a logic level one, the logically false state is a logic level zero, and if the logically true state is a logical level zero the logically false state is a logic level one. Therefore each signal described herein may be designed as positive or negative logic, where negative logic can be indicated by a bar over the signal name or an asterisk following the name. In the case of a negative logic signal the signal is active low where the logically true state corresponds to a logic level zero. In the case of a positive logic signal the signal is active high where the logically true state corresponds to a logic level one.

Further more, many other varied embodiments that incorporate the teaching of the disclosure may be easily constructed by those skilled in the art. Accordingly the present disclosure is not intended to be limited to the specific form set forth herein, but on the contrary, it is intended to cover such alternatives, modifications, and equivalents as can be reasonably included within the spirit and scope of the invention. The preceding detailed description is, therefore, not to be taken in a limiting sense, and the scope of the present disclosure is defined only by the appended claims.

What is claimed is:

1. A system comprising:
    a well bias circuit including:
        an input;
        an output to provide bias to a charge well;
    a sensor including an output to provide a first signal associated with a first threshold condition;
    logic including:
        a first input coupled to said output of said sensor;
        a first output coupled to said input of said well bias circuit, said first output to provide a second signal to said input of said well bias circuit;
    wherein said logic is to assert said second signal if said first signal indicates that the first threshold condition has been exceeded; and
    an enable circuit including an output, said enable circuit to provide a third signal indicating said well bias circuit is enabled;
    wherein said logic further includes:
        a second input coupled to said output of said enable circuit; and
    wherein said logic is further to assert said second signal if said third signal indicates said well bias circuit is enabled.

2. The system as in claim 1, further including:
    a well bias circuit including:
        an input;
        an output to provide bias to a charge well;
    a first sensor including an output to provide a first signal associated with a first threshold condition;
    a second sensor including an output to provide a third signal indicating a second threshold condition has been exceeded;
    logic including:
        a first input coupled to said output of said first sensor;
        a first output coupled to said input of said well bias circuit, said first output to provide a second signal to said input of said well bias circuit; wherein
        said logic is to assert said second signal if said first signal indicates that the first threshold condition has been exceeded;
        a second input coupled to said output of said second sensor; and wherein
        said logic is to assert said second signal if said third signal indicates that the second threshold condition has been exceeded.

3. The system as in claim 1, wherein said first threshold condition is exceeded when an amount of current used by said well bias circuit is greater than an amount of leakage current.

4. The system as in claim 3, wherein the amount of leakage current is estimated based on empirical data.

5. The system as in claim 3, wherein the amount of leakage current is determined based on actual leakage measurements.

6. The system as in claim 1, wherein said sensor includes a temperature sensor.

7. The system as in claim 6, wherein said first threshold condition is exceeded when said temperature sensor senses a temperature below about zero degrees Fahrenheit.

8. The system as in claim 1, wherein said sensor includes a current sensor.

9. The system as in claim 8, wherein said current sensor includes:
    a first transistor including:
        a first current electrode coupled to a first voltage potential;
        a second current electrode coupled to a second voltage potential;
        a control n ode coupled to said second current electrode;
    a second transistor including:
        a first current electrode coupled to said first voltage potential;
        a second current electrode;
        a control node coupled to said control node of said first transistor;
    a resistor including:
        a first terminal coupled to said second current electrode;
        a second terminal coupled to said second voltage potential;
    a differential amplifier including:
        a first input coupled to said second current electrode of said second transistor;
        a second input coupled to a regulated voltage source; and
        an output coupled to said output of said sensor.

10. The system as in claim 9, wherein said first threshold condition is exceeded when a voltage at said first input of said differential amplifier is less than a voltage of the regulated voltage source.

11. The system as in claim 1, further including:
    a second sensor including an output to provide a fourth signal indicating a second threshold condition has been exceeded;
    and wherein said logic further includes:
        a second input coupled to said output of said second sensor; and wherein
        said logic is to assert said second signal if said fourth signal indicates that the second threshold condition has been exceeded.

12. The system as in claim 1, wherein said logic further includes:

an inverter including:
  an input coupled to said first input of said logic;
  an output;
an AND gate including:
  a first input coupled to said output of said inverter;
  a second input coupled to a second input of said logic; and
  an output coupled to a second output of said logic.

13. A method comprising:
determining if an amount of current used by a well bias circuit is greater than an amount of leakage current; and
deactivating the well bias circuit if the amount of current used by the well bias circuit is greater than the amount of leakage current.

14. The method as in claim 13, wherein the step of determining includes determining an amount of current based on empirical data.

15. The method as in claim 13, wherein the step of determining includes determining an amount of current based on actual measurements.

16. The method as in claim 15, wherein the actual measurements are performed using a sense-amp.

17. The method as in claim 14, wherein the step of determining includes comparing a voltage related to the amount of leakage current to a reference voltage.

18. The method as in claim 13, wherein the step of determining includes measuring a temperature.

19. The method as in claim 18, wherein the step of determining includes comparing the measured temperature to a threshold temperature.

20. The method as in claim 19, wherein the threshold temperature is a temperature at which the amount of current used by the well bias circuit is greater than an amount of leakage current.

21. The method as in claim 20, wherein the threshold temperature is less than about zero degrees Fahrenheit.

22. The method as in claim 13, further including:
receiving a well bias enable signal indicating whether the well bias circuit is enabled; and
disabling the well-bias circuit if the well bias enable signal indicates the well-bias circuit is not enabled.

23. A system comprising:
a transistor formed in a charge well;
a charge source including:
  an input;
  an output coupled to said charge well;
a sensor having an output to assert a first signal indicating a first threshold condition has been exceeded; and
a controller including:
  a first input coupled to said output of said sensor to receive said first signal;
  an output coupled to said input of said charge source; and wherein
said controller is to deactivate said charge source if said first signal is asserted;
an enable circuit having an output to provide an enable signal; and
wherein said controller further includes a second input coupled to said output of said enable circuit such that said controller prevents said charge source from being enabled when said enable signal is deasserted.

24. The system as in claim 23, wherein said first threshold condition is exceeded when an amount of current used by said charge source is greater than an amount of leakage current.

25. The system as in claim 23, wherein said sensor includes a temperature sensor.

26. The system as in claim 25, wherein said first threshold condition is exceeded when said temperature sensor senses a temperature below about zero degrees Fahrenheit.

27. The system as in claim 23, wherein said sensor includes a current sensor.

28. The system as in claim 27, wherein said first threshold condition is exceeded when said current sensor senses an amount of current greater than a predetermined amount of current.

29. A system comprising:
a well bias circuit including:
  an input;
  an output to provide bias to a charge well;
a sensor including an output to provide a first signal associated with a first threshold condition;
logic including:
  a first input coupled to said output of said sensor;
  a first output coupled to said input of said well bias circuit, said first output to provide a second signal to said input of said well bias circuit;
  wherein said logic is to assert said second signal if said first signal indicates that the first threshold condition has been exceeded, and wherein said first threshold condition is exceeded when an amount of current used by said well bias circuit is greater than an amount of leakage current.

30. A system comprising:
a well bias circuit including:
  an input;
  an output to provide bias to a charge well;
a sensor including an output to provide a first signal associated with a first threshold condition, wherein said sensor includes a temperature sensor;
logic including:
  a first input coupled to said output of said sensor;
  a first output coupled to said input of said well bias circuit, said first output to provide a second signal to said input of said well bias circuit; and
  wherein said logic is to assert said second signal if said first signal indicates that the first threshold condition has been exceeded.

31. A system comprising
a transistor formed in a charge well;
a charge source including:
  an input;
  an output coupled to said charge well;
a sensor having an output to assert a first signal indicating a first threshold condition has been exceeded, wherein said first threshold condition is exceeded when an amount of current used by said charge source is greater than an amount of leakage current; and
a controller including:
  a first input coupled to said output of said sensor to receive said first signal;
  an output coupled to said input of said charge source; and wherein
  said controller is to deactivate said charge source if said first signal is asserted.

32. A system comprising:
a transistor formed in a charge well;
a charge source including:
  an input;
  an output coupled to said charge well;

a sensor having an output to assert a first signal indicating a first threshold condition has been exceeded, wherein said sensor includes a temperature sensor; and a controller including:

a first input coupled to said output of said sensor to receive said first signal;

an output coupled to said input of said charge source; and wherein said controller is to deactivate said charge source if said first signal is asserted.

* * * * *

UNITED STATES PATENT AND TRADEMARK OFFICE
CERTIFICATE OF CORRECTION

PATENT NO. : 6,753,719 B2
DATED : June 22, 2004
INVENTOR(S) : Bhagavatheeswaran et al.

It is certified that error appears in the above-identified patent and that said Letters Patent is hereby corrected as shown below:

<u>Column 7,</u>
Line 54, replace the premble of Claim 2 with -- A system comprising: -- to make Claim 2 an independent claim.

Signed and Sealed this

Twenty-first Day of December, 2004

JON W. DUDAS
*Director of the United States Patent and Trademark Office*